United States Patent [19]
Alder et al.

[11] Patent Number: 5,457,428
[45] Date of Patent: Oct. 10, 1995

[54] METHOD AND APPARATUS FOR THE REDUCTION OF TIME INTERVAL ERROR IN A PHASE LOCKED LOOP CIRCUIT

[75] Inventors: John M. Alder, Den Bosch; Hendricus M. H. Bontekoe, Huizen, both of Netherlands

[73] Assignee: AT&T Corp., Murray Hill, N.J.

[21] Appl. No.: 164,607

[22] Filed: Dec. 9, 1993

[51] Int. Cl.$^6$ .................................................. H03L 7/00
[52] U.S. Cl. .......................... 331/1 A; 331/25; 331/14; 327/141; 327/159; 327/156
[58] Field of Search ...................... 331/1 A, 14, 16, 331/18, 25; 328/155; 375/120, 376; 327/158, 159, 141, 156

[56] References Cited

U.S. PATENT DOCUMENTS

| | | | |
|---|---|---|---|
| 4,817,199 | 3/1989 | Wallraff | 455/260 |
| 4,864,253 | 9/1989 | Zwack | |
| 4,972,442 | 11/1990 | Steierman | |
| 4,980,899 | 12/1990 | Troost et al. | 375/108 |
| 5,059,925 | 10/1991 | Weisbloom | 331/1 A |
| 5,140,284 | 8/1992 | Petersson et al. | |
| 5,202,906 | 4/1993 | Saito et al. | 331/14 |

OTHER PUBLICATIONS

CCITT Draft Recommendation G.81s, Document No. DE/TM-3017-5, pp. 1-8, the publication date of this document is not readily available to the applicants.

*Primary Examiner*—Benny Lee
*Assistant Examiner*—Arnold Kinkead

[57] ABSTRACT

A phase-locked loop circuit which utilizes multiple reference signals is formed with control circuitry to minimize time interval error. The phase-locked loop (PLL) comprises a switching device, phase detector, loop filter governable oscillator, frequency divider, signal sensing circuit and a TIE reduction control circuit. The PLL maintains a substantially constant $\pi/2$ radians between a first reference signal and its phase-locked output. Upon loss of the first reference signal, the signal sensing circuit causes the switching device to switch to a second reference signal. The second reference signal is of the same frequency but unknown phase relationship with the interrupted first reference signal. Upon switch over, the TIE reduction control circuit causes the frequency divider output to be interrupted and forced high for a quarter-cycle of the period of the reference signals to force the PLL to phase-lock on the second reference signal with minimal TIE.

31 Claims, 5 Drawing Sheets

| CURRENT STATE | INPUTS $V_S$ $V_{REF}$ | OUTPUT R | NEXT STATE |
|---|---|---|---|
| S0 | 0 0 | 0 | S1 |
| S0 | 0 1 | 0 | S1 |
| S0 | 1 0 | 0 | S0 |
| S0 | 1 1 | 0 | S0 |
| S1 | 0 0 | 0 | S1 |
| S1 | 0 1 | 0 | S1 |
| S1 | 1 0 | 0 | S2 |
| S1 | 1 1 | 0 | S1 |
| S2 | 0 0 | 0 | S1 |
| S2 | 0 1 | 0 | S1 |
| S2 | 1 0 | 0 | S2 |
| S2 | 1 1 | 0 | S3 |
| S3 | 0 0 | 1 | S0 |
| S3 | 0 1 | 1 | S0 |
| S3 | 1 0 | 1 | S0 |
| S3 | 1 1 | 1 | S0 |

250 → S1 (row 2)

METHOD AND APPARATUS FOR THE REDUCTION OF TIME INTERVAL ERROR IN A PHASE LOCKED LOOP CIRCUIT

FIELD OF INVENTION

The invention relates generally to frequency synthesizers and electronic timing apparatus and methods, and more specifically to phase-locked loop circuits having multiple reference signals.

BACKGROUND OF THE INVENTION

Phase-locked loop ("PLL") circuits have been used for many years and are electronic circuits for locking an oscillator in phase with a reference signal. PLL circuits are often utilized within receivers in digital communication systems for the purpose of generating a local clock signal which is phase aligned with an incoming reference signal. The phase aligned local clock signal facilitates the receipt and processing of synchronous data sent by a transmitter in the communication system.

A conventional PLL circuit comprises a phase detector, a filter and a voltage-controlled oscillator ("VCO"). In the conventional PLL circuit, the phase detector compares the incoming reference signal and the output of the VCO. The phase detector generates an error signal that is representative of the phase difference of the reference signal and the VCO output. The error signal is filtered and applied to the control input of the VCO to produce an output signal that tracks the phase of the reference signal.

A potential problem exists for a PLL circuit used for the generation of a local clock signal for the synchronous reading of transmitted data, when the incoming reference signal is lost or interrupted. The output frequency of the VCO may drift during the absence of the reference signal, potentially causing a receiver to read the received data out of synchronization.

One prior art technique to maintain a constant phase-locked local clock signal relies on the use of multiple reference signals of the same frequency. In a circuit according to this technique, a multiplexer connects one of the multiple reference signals to an input of a PLL circuit. Sensing circuitry is used to detect any interruption of this reference signal. Upon detecting an interruption of the reference signal, the sensing circuitry causes the multiplexer to switch to a different reference signal. U.S. Pat. No. 4,972,442 to Steierman, issued on Nov. 20, 1990, describes such a prior art system which utilizes a microprocessor to switch over to the different reference signal.

A disadvantage of U.S. Pat. No. 4,972,442 and other prior art multiple reference PLLs is the lack of circuitry or other means to minimize the undesirable effects to circuit performance caused by a sudden phase difference between reference signals applied to the input of the PLL circuit before and after a switch over. For example, if the sudden shift in phase were sufficiently large, the PLL circuit may lose its phase lock, or be otherwise adversely affected, to cause the receiver to misread one or more of the incoming bits of information. As a result, the receiver would read data out of synchronization.

One measure of the effects on circuit performance caused by a sudden phase change at the PLL circuit input is time interval error ("TIE"). TIE is defined as the variation of the time delay of the generated phase-locked signal with respect to the reference signal at the input of the PLL circuit over a period of time. The TIE over a period of S seconds is defined to be the magnitude of the difference between the time delay values measured at the end and at the beginning of this period, i.e., TIE(S)=|ΔT(t+S)−ΔT(t)|, where TIE(S) is the time interval error over time S and ΔT(t) is the time delay at time t.

If a first reference signal and a second reference signal are in phase alignment, the TIE of the PLL output signal after switch over from the first reference signal to the second will be zero. In the alternative, if a phase variation exists between the first and second reference signals, then a TIE of a particular magnitude will occur for a time period between switch over and a point in time when the PLL circuit output signal has settled down and phase-locked on the second reference signal.

A phase difference of π radians between the first and second reference signals represents a worst case condition for prior art PLL circuits. There is a substantial likelihood that a prior art PLL circuit could not track such a drastic instantaneous phase difference and as a result would lose its phase lock and enter a frequency runaway condition.

In the alternative, if the PLL circuit which generated a phase-locked signal based on a 64 KHz reference signal, did not lose its lock, a TIE of 7812.5 ns or a phase variation corresponding to one-half of a cycle would exist for the time period that the output signal is out of phase with the second reference signal by π radians. The International Telegraph and Telephone Consultative Committee (CCITT) has a proposed recommendation that any TIE generated by a PLL circuit used to generate reference timing signals in a communication system should not be greater than 1000 ns for a time period of 15 seconds or longer.

It is desirable to have a multiple reference signal PLL circuit that will produce minimal TIE at a switching of reference signals. Further, it is desirable that such a circuit be of minimal complexity and constructed of inexpensive components.

SUMMARY OF THE INVENTION

The present invention comprises a PLL circuit utilizing multiple reference signals in the generation of a phase-locked signal. The PLL circuit can switch between the reference signals upon loss or interruption of a particular reference signal that is being used for the generation of the phase-locked signal. The PLL circuit also contains TIE reduction control circuitry to minimize the TIE immediately after a switch between reference signals. The control circuitry operates on the phase-locked signal in a manner so that it is phase-locked to a new reference signal within one-cycle period of the new reference signal. Thereby, the resulting TIE over a time period substantially greater than the period of the reference signals is minimal.

An advantage of the present invention is an effective reduction in TIE in a PLL circuit having multiple reference signals. Another advantage of the present invention is that it can be constructed of inexpensive off the shelf components which are readily available.

DETAILED DESCRIPTION

Figure 1:
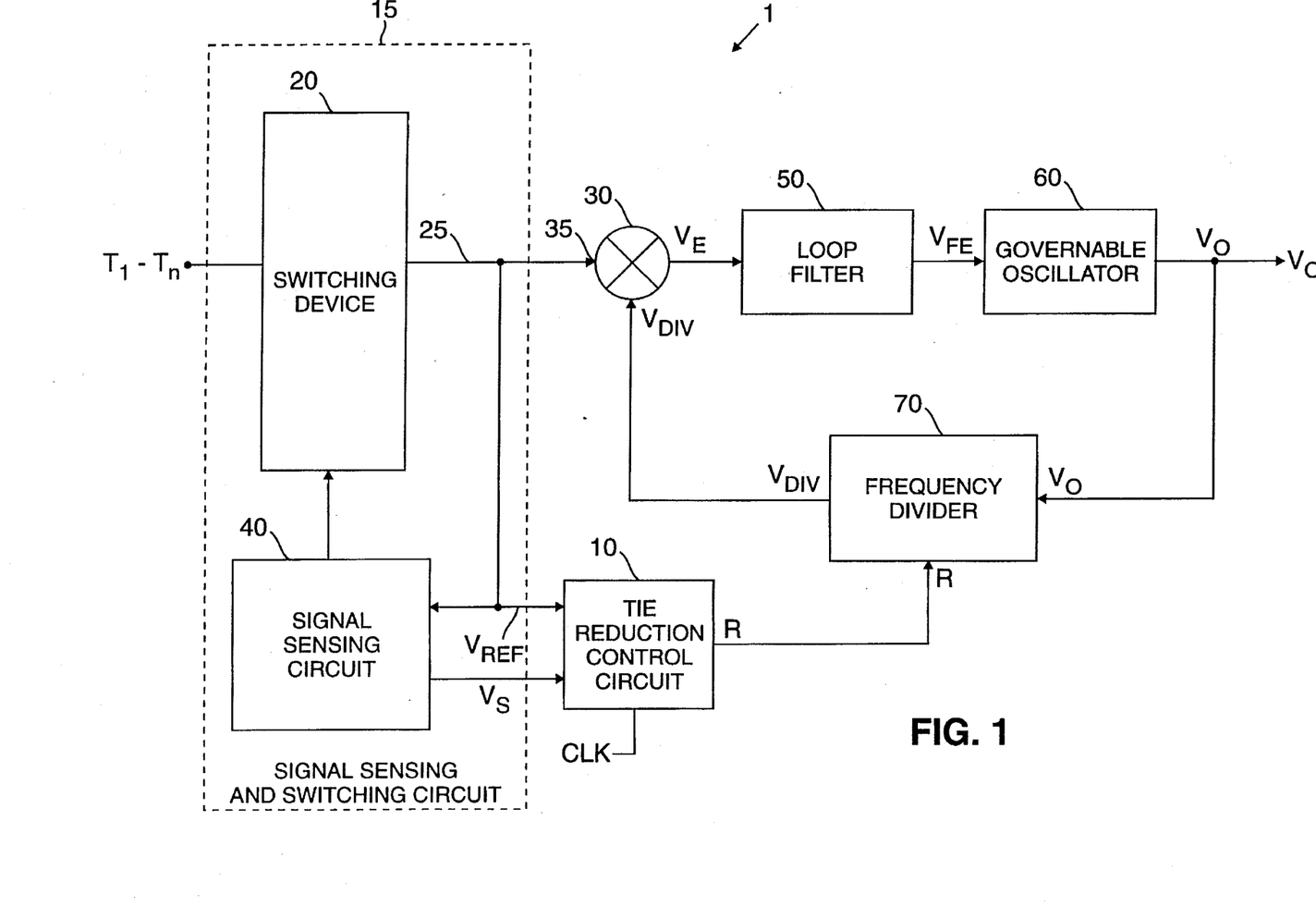
FIG. 1 is a schematic diagram of a phase-locked loop circuit in accordance with the present invention.

One embodiment of a multiple reference phase-locked loop circuit 1 according to the present invention is shown in FIG. 1. In the PLL circuit 1 of FIG. 1, a plurality n of reference signals $T_1$-$T_n$ are connected to a switching device 20 which selectively connects one of the plurality of reference signals $T_1$-$T_n$ to a line 25 which is connected to an input 35 of a phase detector 30. Suitable components for the switching device 20 include a multiplexer and a relay with two or more inputs and a single output. The reference signal applied to line 25 is also represented by $V_{REF}$. The reference signals $T_1$-$T_n$ have a common frequency and may vary in their phase relationship with respect to one another.

The line 25 is also connected to a signal sensing circuit 40 and a TIE reduction control circuit 10. The signal sensing circuit 40 is connected to the switching device 20 to control which reference signal of the n reference signals $T_1$-$T_n$ is to be connected to line 25. The signal sensing circuit 40 detects an interruption of the reference signal on line 25 and causes the switching device 20 to apply a different reference signal of the n reference signals to line 25. The signal sensing circuit 40 also generates a switch signal $V_S$ when a reference signal switch over occurs. The switch signal $V_S$ is applied to the TIE reduction control circuit 10. A clock signal CLK is also applied to the TIE reduction control circuit 10 to provide timing pulses for logic operations.

The phase detector 30 produces an output signal $V_E$ which is filtered by a loop filter 50 to produce a filtered signal $V_{FE}$. The filter output signal $V_{FE}$ is applied to a governable oscillator 60. The governable oscillator 60 generates a local clock signal $V_O$ which is the output signal of PLL circuit 1.

Figure 2:
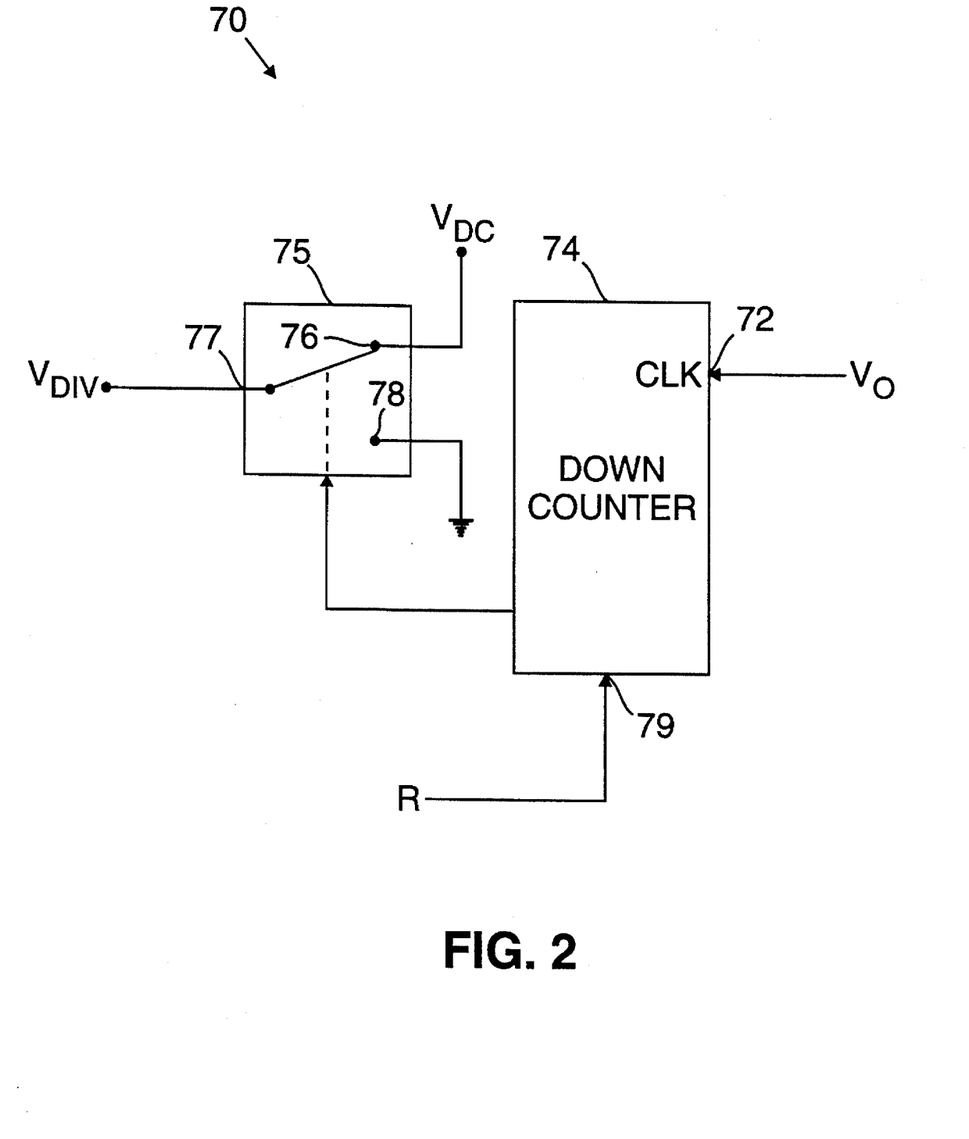
FIG. 2 is a schematic diagram of a suitable frequency divider circuit for the circuit of FIG. 1.

The governable oscillator output $V_O$ is also applied to a frequency divider 70 which generates an output signal $V_{DIV}$. A suitable circuit for the frequency divider 70 is shown in FIG. 2 as discussed further below. The frequency divider 70 of FIG. 1 should be selected such that its frequency divides its input signal $V_O$ by a predetermined amount to generate the output signal $V_{DIV}$ with a frequency equal to the frequency of the incoming reference signals $T_1$-$T_n$. The frequency divided signal $V_{DIV}$ is applied to the phase detector 30. The frequency divider 70 is necessary because often, the required frequency of the generated phase-locked signal is substantially higher than that of the received reference signals. The frequency divider 70 is also adapted to receive a reset signal R generated by the TIE reduction control circuit 10.

In normal operation, the signal sensing circuit 40 directs the switching device 20 to connect one of the incoming reference signals $T_1$-$T_n$ to line 25 and upon detecting an interruption of the signal on line 15, the signal sensing circuit 40 directs the switching device 20 to connect a different reference signal to line 15. Thus, within circuit 1, the switching device 20 and the signal sensing circuit 40 comprises a signal sensing and switching circuit 15 shown encompassed by a broken outline in FIG. 1. Although within the signal sensing and switching circuit 15, the signal $V_S$ is generated by the sensing circuit 40, it would be readily understood by those skilled in the art that the switching device 20 or other switch over detection means could produce the signal $V_S$ upon the occurrence of a reference signal switch over.

The phase detector 30 measures the phase difference of the reference signal on line 25 and the frequency divided signal $V_{DIV}$ and generates the error signal $V_E$ based on the difference. The error signal $V_E$ is then filtered by loop filter 50 to eliminate any high frequency noise to produce the output signal $V_{FE}$. The $V_{FE}$ output signal controls the governable oscillator output signal $V_O$ so as to eliminate any phase difference between $V_{DIV}$ and the reference signal $V_{REF}$ present on line 25.

When the PLL circuit 1 is used in a receiver to generate a local clock signal for the synchronous reception of data, a suitable phase detector for the phase detector 30 is an exclusive-OR type phase detector. An exclusive-OR type phase detector comprises an exclusive-OR gate connected to a counter which measures the lead or lag time between rising edges of the two phase detector input signals. The error signal $V_E$ is then generated with a magnitude corresponding to the measured lead or lag time between the input signals. Other suitable phase detectors are a diode phase detector, or a double-balanced mixer phase detector which are commonly used in the art.

Phase detectors in PLL circuits typically operate to maintain a π/2 radians phase difference between an input reference signal and the generated output phase-locked signal. In an exclusive-OR type phase detector, if the initial difference of the phase detector input signals is between 0 and π radians, the phase detector will operate in its negative feedback region and generate the error signal $V_E$ so as to achieve and maintain a π/2 radian phase difference between the input signals. In the alternative, if the phase difference of the phase detector input signals is between −π/2 and 0, or π and 3π/2, the phase detector will operate in its positive feedback region and generate the error signal $V_E$ so as to force the input signals phase detectors to operate in its negative region at which point the phase detector will operate as described above.

It is desirable in the PLL circuit 1 of FIG. 1 that the phase detector 30 operates to achieve and maintain a substantially constant phase difference between the reference signal on line 25 and the output signal $V_O$ in order to effectively reduce TIE at a reference signal switch over. Although in the following described embodiment of the present invention, the substantially constant phase difference is π/2 radians, it will be readily understood by those skilled in the art that the present invention can be adapted to operate with other substantially constant phase relationships.

The loop filter 50, which filters the phase detector output signal $V_E$, can be a low-pass filter of either analog or digital design. The purpose of the loop filter 50 is to filter out the high frequency components of the relatively DC error signal $V_E$ to produce the filtered error signal $V_{FE}$. The elements of loop filter 50 should be selected to cause a Bessel-type response for the PLL circuit 1 such that a substantially constant time delay is produced in the circuit 1 for a large range of frequencies.

The filtered error signal $V_{FE}$ is applied to the governable oscillator 60. A voltage controlled oscillator may be used as the controllable oscillator 60. If greater stability of the output signal $V_O$ is desired, a voltage-controlled crystal oscillator or temperature compensated crystal oscillator may be utilized.

Further details of one suitable frequency divider circuit 70 are shown in FIG. 2. Referring to FIG. 2, the governable oscillator output signal $V_O$ of FIG. 1 is applied to a clock terminal 72 of a down counter circuit 74. The down counter circuit 74 is also connected to a controllable switch 75 which can selectively connect a switch output 77 to a DC voltage $V_{DC}$ at its pole 76 or to a ground connection at its pole 78. The resulting signal generated at the switch output 77 is the frequency divided output signal $V_{DIV}$. The TIE reduction control circuit output signal R of FIG. 1 is applied to a reset input 79 of the down counter circuit 74.

In normal operation, the frequency divider circuit 70 loads the down counter circuit 74 with a half-cycle value equal to one-half of the amount by which the frequency is to be divided. For example, if the frequency divider circuit 70 is to divide the frequency of signal $V_O$ by 486 then the down counter circuit 74 is loaded with a half-cycle value of 243, i.e., 486/2. The down counter circuit 74 will then decrement the half-cycle value at a rate governed by the frequency of the signal $V_O$ applied to the clock input 72. When the counter reaches zero, it simultaneously resets the down counter 74 to the half-cycle value and generates a signal directing the controllable switch 75 to switch the connection of the output 77 to $V_{DC}$ if presently connected to ground, or to ground if presently connected to voltage $V_{DC}$.

Thus, the frequency divided signal $V_{DIV}$ will be generated by sequentially connecting the controllable switch output 77 to ground for half the period of the desired frequency of signal $V_{DIV}$ and to $V_{DC}$ for the other half of the period of the signal $V_{DIV}$. For example, the frequency divider circuit 70 in the divide-by-486 example described above will connect $V_{DIV}$ to ground for 243 cycles of the phase-locked signal $V_O$ and to the voltage $V_{DC}$ for the next 243 cycles of the phase-locked $V_O$ and so on. Thereby, the frequency divider 70 will generate one cycle of the signal $V_{DIV}$ for every 486 cycles of the phase-locked signal $V_O$. As a consequence, the signal $V_O$ has a frequency equal to the frequency of the signal $V_O$ divided by 486.

The PLL circuit 1 of FIG. 1 minimizes TIE caused by a phase variation between reference signals at a switch over by taking advantage of the substantially constant $\pi/2$ radians or quarter-cycle phase difference of the reference signal $V_{REF}$ on line 25 and the frequency divided signal $V_{DIV}$. In operation, at switch over from a first to a second reference signal, the signal sensing circuit 40 will generate the signal $V_S$ notifying the TIE reduction control circuit 10 of the switch over. Upon receipt of the switch signal $V_S$, the TIE reduction control circuit 10 will generate the signal R at the first rising edge of the second reference signal.

The signal R interrupts the frequency divider 70 and abruptly forces the frequency divider 70 to generate the signal $V_{DIV}$ with a high logic level for a quarter cycle of the normal frequency of $V_{DIV}$. The frequency divider 70 is then permitted to operate normally after the completion of the quarter cycle of $V_{DIV}$ in a high logic level by generating a low logic level for a half cycle and so on.

By forcing the frequency divided signal $V_{DIV}$ to a high logic level for a quarter cycle, the circuit is forcing the signal $V_{DIV}$ to lead the new reference signal by $\pi/2$ radians and thereby abruptly forcing the generated clock signal $V_O$ to be phase-locked on the new reference signal. As a consequence, a TIE will exist for no longer than the relatively short period of time from switch over to the first rising edge of the second reference signal. Thus, if TIE is measured over a substantially long period of time relative to the period of $V_{DIV}$ then the TIE will be minimal.

With a reference signal of 64 kHz and a generated local clock signal $V_O$ of 31,104 MHz, TIE over a time period of 15 seconds will be kept to below 300 ns which is well below the 1000 ns limit proposed by the CCITT. This represents a substantial improvement over prior art systems which could generate a TIE of approximately 7812.5 ns in a worst case condition.

When referring to FIG. 2 in the remainder of the description, the connection of the switch output 77 to $V_{DC}$ and ground at poles 76 and 78 will be referred to as the high logic level and low logic level, respectively, of the output signal $V_{DIV}$ of the frequency divider 70. The reset signal R, which is generated by the TIE reduction control circuit 10 at the first rising edge of the new reference signal, causes the down counter circuit 74 of FIG. 2 to simultaneously reset its count to a quarter-cycle value and to force the switch 75 output signal $V_{DIV}$ into a high logic level. For example, if the frequency divider 70 was operating to divide-by-486 as in the example described above, the quarter cycle value would be 121, i.e., 486/4.

After counting down to zero from the quarter cycle value, the frequency divider 70 is permitted to operate in its normal manner by causing the $V_{DIV}$ signal at the switch output 77 to enter a low logic level and resetting the counter to a half-cycle value. As a consequence, the output signal $V_O$ is abruptly forced to follow the new reference signal on line 25 of FIG. 1 by $\pi/2$ radians and thereby, is forced to phase-lock on the new reference signal without requiring the normal TIE producing settling period of prior art systems.

It is readily understood by those skilled in the art that the present invention may work in an inverted manner to that described above by resetting the frequency divider output 77 to a low state for a quarter cycle period following the first falling edge of the new reference signal.

The present invention achieves a substantial reduction of TIE caused by a switch over independent of the phase difference of the reference signals applied to the line 25 of FIG. 1. The operation of the PLL circuit 1 of FIG. 1 with respect to various phase relationships between two 64 kHz input reference signals is illustrated in signal timing diagrams 100, 120 and 140 of FIG. 3.

Figure 3:
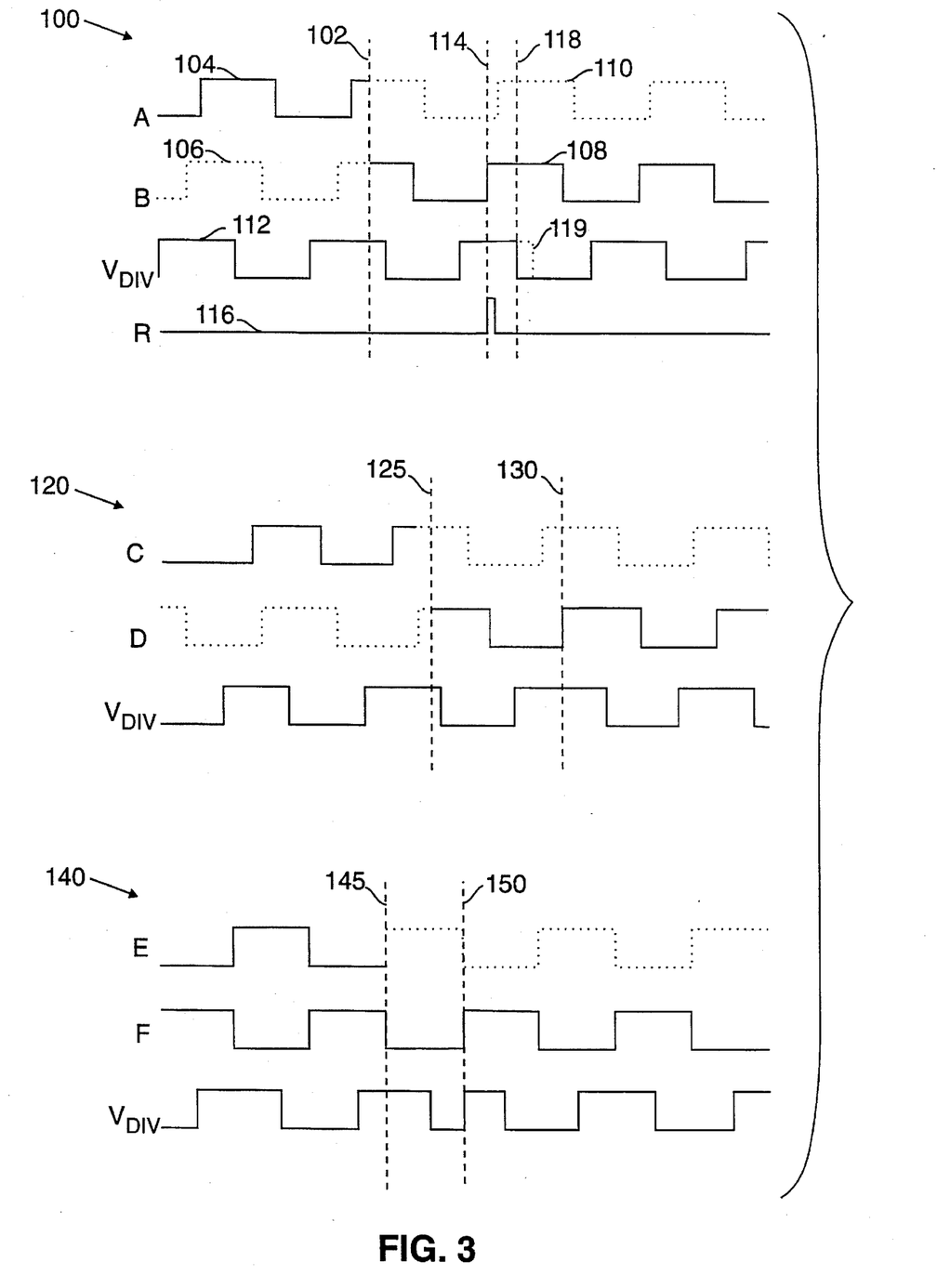
FIG. 3 consists of timing diagrams of various signals received and generated in the circuit of FIG. 1.

More specifically, the timing diagram 100 of FIG. 3 depicts the generated frequency divider output $V_{DIV}$ when an input reference signal A lags a reference signal B by less than $\pi$ radians. The timing diagram 120 illustrates the generated signal $V_{DIV}$ when a reference signal C leads a reference signal D by less than $\pi$ radians. The timing diagram 140 illustrates the timing relationship between the generated signal $V_{DIV}$ when a reference signal E and a reference signal F differ in phase by $\pi$ radians.

In FIG. 3, the portions of the reference signals that are applied to the line 25 of FIG. 1 by switching device 20 of FIG. 1 are represented by solid lines, while the portions of the signals which are not connected though to line 25 and phase detector input 35 are represented with broken lines. For example, in timing diagram 100, the reference signal A is connected to the line 25 before time 102 and is shown by a solid line 104. Prior to time 102, the reference signal B is not connected to the line 25 and as a result is shown by a broken line 106. At time 102, the signal sensing circuit 40 causes switching device 20 to switch the signal applied to line 25 from the reference signal A to the reference signal B. Thus, after time 102, the reference signal B is applied to line 25, and the portion of signal B after time 105 is shown as a solid line 108. Similarly, after time 105, the reference signal A is no longer applied to line 25, and as a result is shown as broken line 110.

Transition times for switch over, and rise and fall times of the signals are illustrated in FIG. 3 as relatively instantaneous because such transition times have a negligible effect on the operation of PLL circuit 1 when the frequency of the associated reference signals is on the order of 64 kHz.

In the timing sequence 100, the reference signal A lags the reference signal B by less than $\pi$ radians. The corresponding frequency divided output signal $V_{DIV}$, which is based on the output signal $V_O$, is illustrated by a waveform 112. Just prior to time 102, the signal $V_{DIV}$ leads the reference signal A by $\pi/2$ radians. At time 102, the reference signal applied to the line 25 and the phase detector input 35 is switched from A to B. Immediately after time 102, the signal $V_{DIV}$ no longer leads the reference signal at the phase detector input 35 by $\pi/2$ radians. However, at a time 114, which is the first rising edge of the reference signal B after time 102, the reset signal R is generated as shown by a waveform 116 causing the frequency divider 70 to reset to a quarter-cycle value with its output in a high logic state. Thus, at the time 114, the signal $V_{DIV}$ which is in a high logic level immediately prior to time 114, will remain in a high logic level for a quarter cycle period until a time 118 instead of continuing on to complete its normal half-cycle as shown by a broken line 119.

After time 118, the frequency divider 70 is permitted to operate in its normal manner by alternating the signal $V_{DIV}$ between the high and low logic levels so as to lead the reference signal B by $\pi/2$ radians. In a similar manner, if the signal $V_{DIV}$ was in a low logic state immediately prior to the first rising edge of the reference signal B at time 114, the signal $V_{DIV}$ would be forced to a high logic state when the frequency divider 70 is reset to a quarter-cycle value at time 114. Thus, the signal $V_{DIV}$ will be abruptly forced to lead the reference signal B by $\pi/2$ radians at the time 114, the first rising edge of the reference signal B after a switch over, independent of the logic state of the reference signal B immediately prior to time 114.

However, in prior art systems without TIE reduction circuitry, the signal $V_{DIV}$, at a switch over, would not be abruptly forced to lead the reference signal B by $\pi/2$ radians at time 114 and would slowly shift from leading the reference signal A by $\pi/2$ radians to leading the reference signal B by $\pi/2$ radians over the course of several cycles depending on the PLL loop bandwidth.

In such prior art systems, if the loop bandwidth was relatively small, which is typical in PLL circuits used in receivers, it could take several seconds before the signal $V_{DIV}$ phase-locked on the reference signal B resulting in a large TIE for a substantially long period of time. In contrast, as shown in the timing diagram 100, the present invention will generate a TIE for only the relatively short period of time between times 102 and 114.

In timing sequence 120, the reference signal C leads the reference signal D by less than $\pi$ radians and switch over of the reference signals from the reference signal C to the reference signal D occurs at time 125. Then, at time 130, the time of the next rising edge of reference signal D, the signal $V_{DIV}$, which is in a high logic state immediately prior to time 130, is kept at a high logic level for a quarter-cycle to abruptly force the signal $V_{DIV}$ to lead the reference signal D by $\pi/2$ radians. As a result, the signal $V_O$, which corresponds to the signal $V_{DIV}$, is abruptly phase-locked on the new reference signal D. Thus again, a TIE is generated by the PLL circuit 1 for only a relatively short period of time between times 125 and 130.

The timing sequence 140 depicts the operation of the PLL circuit 1 under a worst case condition for prior art PLL circuits. In timing sequence 140, the reference signal E and the reference signal F differ in phase by $\pi$ radians. In prior art PLL circuits, a sudden $\pi$ radian phase difference at the PLL circuit input would likely cause the PLL circuit to lose its phase-lock. This would result in the generation of a substantially large TIE during the time it takes the PLL circuit to capture and track the new reference signal. Conversely, referring to the timing diagram 140, after switch over at a time 145, the present invention will generate a TIE for a period of time between time 145 and a time 150 which is equal to one-half of the period of the reference signals. Thus, the present invention provides a significant improvement over prior art multiple reference PLL circuits in that the present invention generates a TIE for the relatively short period of time when the reference signals E and F differ by $\pi$ radians.

Figure 4:
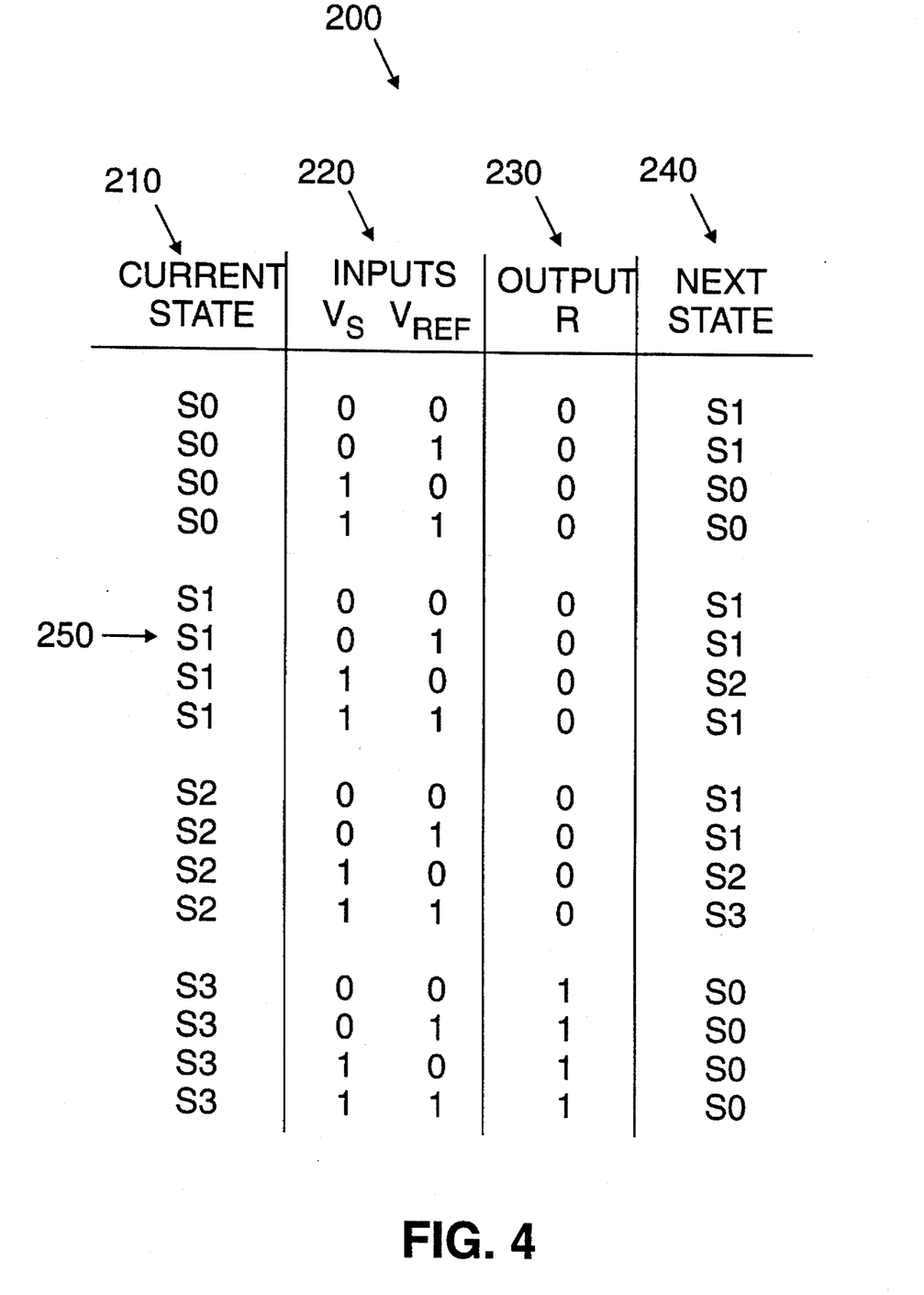
FIG. 4 is a state table for the operation of a TIE reduction control circuit for the circuit of FIG. 1.

The TIE reduction control circuit 10 may operate at a given point in time in one of four states S0–S3 as shown in a state table 200 in FIG. 4. The TIE reduction control circuit 10 may switch to a different one of the states S0–S3 at successive clock cycles of the clock signal CLK based on the values of the input signals $V_S$ and $V_{REF}$, and the current state of the TIE logic control circuit 10.

The clock signal CLK should have a sufficiently high frequency relative to the reference signals so that a substantial number of logic circuit operations can be performed in a relatively small period of time relative to the period of the reference signal $V_{REF}$. For example, in a PLL circuit having a reference signal on the order of 64 kHz, a suitable frequency for the clock signal CLK is 31 MHz. The switch signal $V_S$ generated by the signal sensing circuit 40 will be a pulse for several cycles of the clock signal CLK following a reference signal switch over.

The state table 200 in FIG. 4, lists the next states that the TIE reduction control circuit 10 will enter and the corresponding logic levels of the reset signal R based on the various combinations of logic levels of the input signals $V_S$ and $V_{REF}$, and the current states of the TIE reduction control circuit 10. Referring to FIG. 4, column 210 of the state table 200 contains entries for the current state S0–S3 of the TIE reduction control circuit 10, and column 220 contains the various combinations of the binary logic values for the input signals $V_S$ and $V_{REF}$ for each of the respective current states of column 210.

The output logic values of the reset signal R for each of the current states S0–S3 are listed in the corresponding rows of column 230. The next state which the TIE reduction control circuit 10 will enter at the next clock signal CLK pulse for a given current state and combination of the input signals $V_S$ and $V_{REF}$ is shown in the corresponding rows of column 240. For example, row 250 depicts a condition where the present state of TIE reduction control circuit 10 is S1 and the input signals $V_S$ and $V_{REF}$ are a logic 0 and a logic 1, respectively. The corresponding output signal R shown in row 250 and column 230 is a logic 0 and the next state of the circuit 10 will be an S1 as shown in column 240.

As stated above, the purpose of the TIE reduction control circuit 10 is to generate a reset signal R at the first rising edge of a new reference signal after a switch over. The operation of the TIE reduction control circuit 10 of FIG. 1 will now be described with reference to the table 200 of FIG. 4. In normal operation, when a reference signal on line 25 of FIG. 1 is not interrupted, the TIE reduction control circuit 10 is operating in the state S1 and the output signal R will be a logic 0. While in state S1, as long as the circuit input signal $V_S$ is a logic 0 indicating that no switch over has occurred, the TIE reduction control circuit 10 will remain in a state S1 with the reset output signal R remaining a logic 0.

Upon a switch over of reference signals, the signal sensing circuit 40 of FIG. 1 will cause the TIE reduction control circuit input signal $V_S$ to go to a logic 1. At that time, if the new reference signal $V_{REF}$ is at a logic 0 of its cycle, the TIE reduction control circuit 10 will switch to state S2. The reference signal $V_{REF}$ will enter a logic 0 and not remain a logic 1 because it is an oscillating signal. However, if the new reference signal $V_{REF}$ is at a logic 1 of its cycle when $V_S$ goes to a logic 1, the TIE reduction control circuit 10 will remain in state S1 until the new reference signal $V_{REF}$ enters a logic 0 state of its cycle at which time the TIE reduction control circuit 10 will switch to state S2.

Once in state S2, the output signal R will remain a logic 0 because the first rising edge of the new reference signal $V_{REF}$ after the switch over has not yet occurred. If the circuit input signals $V_S$ and $V_{REF}$ remain a logic 1 and 0, respectively, the TIE reduction control circuit 10 will remain in state S2. However, when the reference signal $V_{REF}$ enters a logic 1 state indicating that its first rising edge has occurred, the circuit 10 will enter state S3. In the alternative, if the input signal $V_S$ reverts to a logic 0 before the reference signal $V_{REF}$ becomes a logic 1, the TIE reduction control circuit 10 will revert to state S1 at the next clock signal CLK pulse because the signal $V_S$ did not remain a logic 1 sufficiently long enough to indicate a true switch over. In this instance, the misreading of the logic 1 for the switch signal $V_S$ may be due to noise in the circuit or other extraneous factors or conditions.

Upon entering state S3, the TIE reduction control circuit 10 will generate a logic 1 for the reset signal R, thereby, directing the frequency divider 70 to reset to a high logic level for a quarter cycle period. At the very next clock signal CLK pulse, the TIE reduction control circuit 10 will enter state S0 independent of the logic levels of the input signals. Once in state S0, the output reset signal R of circuit 10 will then revert to a logic 0. Thus, the reset signal R will be generated for a time of one clock cycle CLK of the clock signal. In the example, described above, the clock signal CLK had a frequency of 31 MHz and the resulting generated reset signal R would have a duration of approximately 32 ns. The TIE reduction control circuit 10 will remain in state S0 until the switch signal $V_S$ reverts to its normal state of logic 0. At that time, the circuit 10 will switch to state S1 and monitor the input signals for the next switch over condition.

Figure 5:
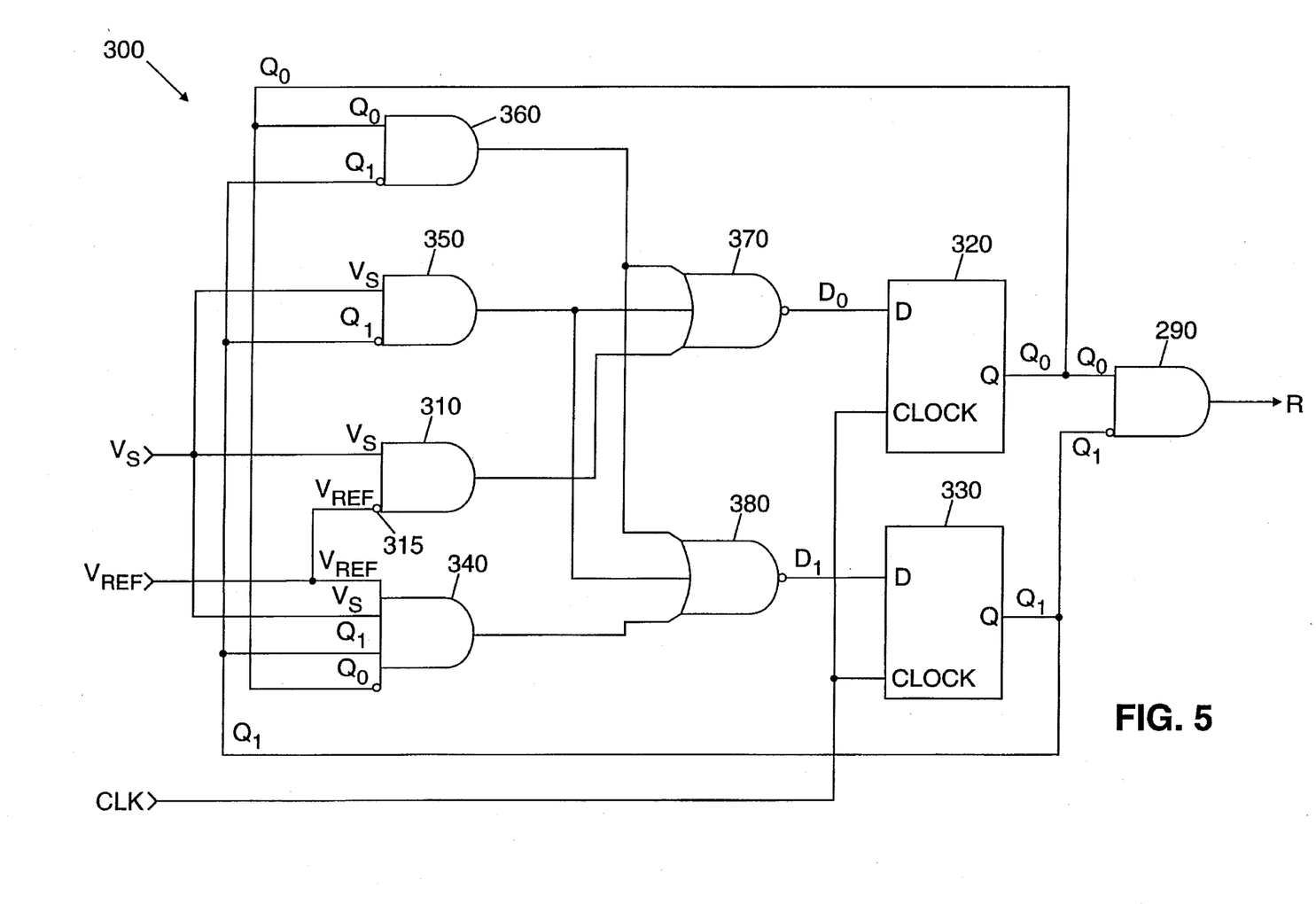
FIG. 5 is a schematic diagram of a suitable circuit TIE reduction control circuit characterized by the table of FIG. 4.

A suitable logic circuit 300 to perform the operations of TIE reduction control circuit 10 of FIG. 1 as characterized by the state table 200 of FIG. 4 is shown in FIG. 5. Referring to FIG. 5, the logic circuit 300 has signal inputs $V_S$, $V_{REF}$ and CLK, and an output reset signal R, which correspond to the input and output signals of the TIE reduction control circuit 10 of FIG. 1. In FIG. 5, the input signals $V_S$ and $V_{REF}$ are applied to a first AND gate 310. The signal $V_{REF}$ is inverted at the respective input of gate 310 as is represented by a bubble 315 at the corresponding input of AND gate 310. Throughout FIG. 5, the inversion of a signal at an input of a gate is represented by a bubble, such as the bubble 315 at the input of AND gate 310.

The input signals $V_S$ and $V_{REF}$ along with signals $Q_0$ and $Q_1$ are applied to a second AND gate 340. The signal $Q_0$ is inverted at the input of AND gate 340. The signals $Q_0$ and $Q_1$ are generated at Q outputs of D-type flip-flops 320 and 330, respectively. The input signal $V_S$ and the signal $Q_1$ are applied to a third AND gate 350 and signals $Q_0$ and $Q_1$ are applied to a fourth AND gate 360. The signal $Q_1$ is inverted at the inputs to the third and fourth AND gates 350 and 360.

The signals generated by the first, third and fourth AND gates 310, 350 and 360 are fed to a first NOR gate 370 which generates the signal D0. The signals generated by the second, third and fourth AND gates 340, 350 and 360 are fed to a second NOR gate 380 which generates a signal D1. Signals D0 and D1 are applied to the flip-flops 320 and 330, respectively. The flip-flops 320 and 330 also receive the clock signal CLK. The output signals $Q_0$ and $Q_1$ of flip-flops 320 and 330, respectively, are applied to a fifth AND gate 390 which generates the logic circuit output signal R. The signal $Q_1$ is inverted at the input of the fifth AND gate 390.

The logic circuit 300 of FIG. 5 generates the reset signal R based on the inputs $V_S$ and $V_{REF}$, and the current state of flip-flops 320 and 330, in the manner specified by the state table 200 of FIG. 4. The corresponding logic states of flip-flops 320 and 330 of FIG. 5 to the status S0–S3 of FIG. 4 are as follows: state S0 corresponds to flip-flop output signals $Q_0$ and $Q_1$ both equal to a logic 0; state S1 corresponds to flip-flop output signals $Q_0$ and $Q_1$ equal to logic 0 and logic 1, respectively; state S2 corresponds to flip-flop output signals $Q_0$ and $Q_1$ equal to a logic 1 and logic 0, respectively; and state S3 corresponds to flip-flop output signals $Q_0$ and $Q_1$ both equal to a logic 1.

A circuit utilizing the inverse of the signals and functions to that of circuit 300 may be utilized to generate the signal R. In addition, the fourth and fifth AND gates 360 and 390 perform the same function of combining the signals $Q_0$ and inverted $Q_1$. As a consequence, the fifth AND gate 390 can be eliminated with the reset signal R being generated at the output of the fourth AND gate 360. It will be readily understood by those skilled in the art that various other logic circuit configurations exist which can generate a reset signal R, in the manner set out in the state table 200 of FIG. 4. In the alternative, the necessary generation of the reset signal R could be accomplished utilizing a microprocessor, microcontroller or other suitably programmed processing devices or circuits.

While the invention has been described in terms of a specific implementation, it should be apparent that the present invention can be constructed using other analog or digital implementations including other implementations for the phase detector and frequency divider.

We claim:

1. A phase-locked loop circuit for the reduction of time interval error comprising:

a signal sensing and switching circuit having a reference signal output, a switch signal output, and a plurality of inputs adapted to receive a like plurality of reference signals, the signal sensing and switching circuit being operable to selectively provide one of said plurality of reference signals to the reference signal output, wherein upon detecting an interruption or absence of a provided signal at the reference signal output, the signal sensing and switching circuit immediately performs a switch over to provide a different one of said plurality of reference signals to the reference signal output and generates a signal at the switch signal output;

a phase detector having first and second inputs and an output, the first input being connected to the reference signal output of the signal sensing and switching circuit, wherein an error signal is generated at its output corresponding to the difference of the signals at its inputs;

a loop filter having an input and an output, the input being connected to the output of the phase detector;

a governable oscillator having a control terminal and an output, the control terminal being connected to the output of the loop filter;

a frequency divider having a signal input, a reset input and an output, the signal input being connected to the governable oscillator output and the output being connected to the second input of the phase detector, the frequency divider being operable to generate a frequency divided signal at its output based on the signal at its signal input; and a TIE reduction control circuit having first and second inputs and an output, the first input being connected to the signal sensing and switching circuit reference signal output, the second input being connected to the signal sensing and switching circuit switch signal output and the output being connected to the frequency divider reset input, wherein the TIE reduction control circuit is operable to generate a reset signal at its output upon a first particular transition of the reference signal at the reference signal output immediately after a switch over has occurred, and wherein the frequency divider is further operable to force the frequency divided signal to a particular logic level for a predetermined duration upon receipt of the reset signal, the predetermined duration corresponding to a maintained phase relationship between the frequency divided signal and the reference signal at the signal sensing and switching circuit switch signal output.

2. The phase-locked loop circuit of claim 1, wherein the particular logic state is a high logic state.

3. The phase-locked loop circuit of claim 1, wherein the governable oscillator is a voltage-controlled oscillator.

4. The phase-locked loop circuit of claim 1, wherein the governable oscillator is a voltage-controlled crystal oscillator.

5. The phase-locked loop circuit of claim 1, wherein the TIE reduction control circuit is a combinational logic circuit.

6. The phase-locked loop circuit of claim 1, wherein the TIE reduction control circuit is a processor.

7. The phase-locked loop circuit of claim 1, wherein the maintained phase relationship is a substantially constant $\pi/2$ radians.

8. The phase-locked loop circuit of claim 1, wherein the TIE reduction control circuit generates a reset signal at its output at the first rising edge of the reference signal at the signal sensing and switching circuit reference signal output.

9. The phase-locked loop circuit of claim 1, wherein the signal sensing and switching circuit comprises:

a switching device with a control input for selectively providing one of said plurality of reference signals to a switch output; and a signal sensing circuit having an input and a control and switch outputs, the input being connected to the switching device output, the control output being connected to the control input of said switching device, wherein upon detecting an interruption of the reference signal at the switching device output, the signal sensing circuit generates a signal at its switch output and causes the switching device to connect a different one of said plurality of reference signals to its output.

10. The phase-locked loop circuit of claim 9, wherein the switching device is a multiplexer.

11. The phase-locked loop circuit of claim 9, wherein the switching device is a multiple input relay.

12. The phase-locked loop circuit of claim 11, wherein the multiple input relay has two inputs.

13. The phase-locked loop circuit of claim 1, wherein the signal sensing and switching circuit comprises:

a switching device with a control input, a plurality of reference signal inputs, a reference signal output and a switch output, the plurality of reference signal inputs are adapted to receive the plurality of reference signals, wherein the switching device is controllable to selectively connect one of said plurality of reference signals to the reference signal output and the switching device generates a signal at the switch output upon connecting a different reference signal of the plurality of reference signals to the reference signal output; and a signal sensing circuit having an input, a control output and switch outputs, the input being connected to the switching device reference signal output, the control output being connected to the control input of said switching device, wherein upon detecting an interruption of the reference signal at the reference signal output, the signal sensing circuit generates a signal at its control output and causes the switching device to connect a different one of said plurality of reference signals to the reference signal output.

14. The phase-locked loop circuit of claim 13, wherein the switching device is a multiplexer.

15. The phase-locked loop circuit of claim 13, wherein the switching device is a multiple input relay.

16. The phase-locked loop circuit of claim 15, wherein the multiple input relay has two inputs.

17. The phase-locked loop circuit of claim 1, wherein the phase detector is an exclusive-OR type phase detector.

18. The phase-locked loop circuit of claim 1, wherein the loop filter is a low pass filter.

19. The phase-locked loop circuit of claim 1, wherein the phase-locked loop circuit produces a Bessel-type response.

20. The phase-locked loop circuit of claim 7, wherein the frequency divider comprises:

a switch having first and second signal inputs, a control input and a signal output, the first signal input being connected to a ground, the second signal input being connected to a DC voltage source, wherein the switch connects the signal output to either of its first or second inputs depending upon a signal present at the control input; and a counter having a count value and a clock input, a reset input and an output, the clock input is connected to the governable oscillator output and the reset input is connected to the reset output of the TIE reduction control circuit, wherein upon completion of a count, the counter generates a signal at its output and resets to the count value and upon receipt of a reset signal at the reset input, the frequency divider resets the counter to a value corresponding to the maintained phase relationship.

21. The phase-locked loop circuit of claim 20, wherein the counter is a down counter.

22. The phase-locked loop circuit of claim 11, wherein the TIE reduction control circuit comprises:

a first, second, third and fourth AND gate, each having a first input, a second inverted input and an output;

a fifth AND gate having a first, second, third and fourth inputs and an output, the fourth input being inverted, a first and second NOR gates, each NOR gate having three inputs and an output; and a first and second D-type flip-flop, each having a D and clock inputs, and a Q output, the D input of the first flip-flop being connected to the first NOR gate output, the D input of the second flip-flop being connected to the second NOR gate output and the clock inputs of the flip-flops being adapted to receive a clock signal, wherein the first input of the first, second and fifth AND gates are connected to the signal sensing and switching circuit switch output, the second input of the first and fifth AND gates are connected to the signal sensing and switching circuit reference signal output, the second input of the second, third and fourth AND gates and the third input of the fifth AND gate are connected to the Q output of the second D-type flip-flop, the first input of the third and fourth AND gate and the fourth input of the fifth AND gate are connected to the Q output of the first D-type flip-flop, the output of the first, second and third AND gates are connected to the inputs of the first NOR gate, the output of the second, third and fifth AND gates are connected to the inputs of the second NOR gate and the reset signal R is generated at the output of the fourth AND gate.

23. A phase-locked loop circuit adapted for receipt of a plurality of reference signals having the same frequency and for generating a phase-locked output signal with a reduced time interval error, the circuit comprising:

a switching device with a control input for selectively providing one of said plurality of reference signals to a switch output;

a signal sensing circuit having an input and control and switch outputs, the input being connected to the switching device output, the control output being connected to the control input of said switching device, wherein upon detecting an interruption of the reference signal at the switching device output, the signal sensing circuit generates a signal at its switch output and causes the switching device to switch over to provide a different one of said plurality of reference signals to its output;

a phase detector having first and second inputs and an output, the first input being connected to the switching device output, wherein an error signal is generated at its output corresponding to the difference of signals at its inputs;

a loop filter having an input and an output, the input being connected to the output of the phase detector;

a governable oscillator having a control terminal and an output, the control terminal being connected to the output of the loop filter;

a frequency divider having a signal input, a reset input and an output, the signal input being connected to the governable oscillator output and the output being connected to the second input of the phase detector, the frequency divider being operable to generate a frequency divided signal at its output based on the signal at its signal input; and a TIE reduction control circuit having a first and second input and an output, the first input being connected to the switching device output, the second input being connected to the switch output of the signal sensing circuit and the output being connected to the frequency divider reset input, wherein the TIE reduction control circuit is operable to generate a reset signal at its output upon a first particular transition of the reference signal at the reference signal output immediately after a switch over has occurred, and wherein the frequency divider is further operable to force the frequency divided signal to a particular logic level for a predetermined duration upon receipt of the reset signal, the predetermined duration corresponding to a maintained phase relationship between the frequency divided signal and the reference signal at the switching device switch output.

24. The phase-locked loop circuit of claim 23, wherein the TIE reduction control circuit generates the reset signal at the first rising edge of the reference signal at the switching device reference signal output.

25. The phase-locked loop circuit of claim 24, wherein the maintained phase relationship is a substantially constant $\pi/2$ radians.

26. The phase-locked loop circuit of claim 25, wherein the particular level is a high logic level.

27. A method of generating a phase-locked signal from multiple reference signals with reduced time interval error comprising:

generating an error signal based on a comparison of the phase relationship between a first reference signal and a frequency divided signal based on the phase-locked signal;

filtering the error signal;

generating the phase-locked signal based on the filtered error signal, wherein the generated phase-locked signal is in a substantially constant phase relationship with a reference signal on which it is based;

frequency dividing the phase-locked signal by a set amount such that the generated frequency divided signal is at substantially the same frequency as the reference signal;

switching over to a second reference signal in the generation of the error signal immediately upon an interruption of the first reference signal, wherein the error signal is based on the phase relationship between the second reference signal and the frequency divided signal;

detecting a first particular transition of the second reference signal after switch over; and forcing the frequency divided signal to a particular logic state for a time duration corresponding to the substantially constant phase relationship with the second reference signal starting upon the detection of the first particular transition of the second reference signal after switch over, wherein the frequency divided signal is forced to abruptly phase-lock on the second reference signal at the first particular transition of the reference signal after switch over.

28. The method of claim 27, wherein the substantially constant phase relationship is $\pi/2$ radians.

29. The method of claim 27, wherein the particular transition of the second reference signal after switch over is the first rising edge of the second reference signal after switch over.

30. The method of claim 27, wherein the particular logic state is a high logic state.

31. A phase-locked loop circuit for the reduction of time interval error comprising:

a signal sensing and switching circuit having a reference signal output, a switch signal output, and a plurality of inputs adapted to receive a like plurality of reference signals, the signal sensing and switching circuit being operable to selectively provide one of said plurality of reference signals to the reference signal output, wherein upon detecting an interruption or absence of a provided signal at the reference signal output, the signal sensing and switching circuit immediately performs a switch over to provide a different one of said plurality of reference signals to the reference signal output and generates a signal at the switch output;

a phase detector having first and second inputs and an output, the first input being connected to the reference signal output of the signal sensing and switching circuit, wherein an error signal is generated at its output corresponding to the difference of the signals at its inputs;

a loop filter having an input and an output, the input being connected to the output of the phase detector;

a governable oscillator having a control terminal and an output, the control terminal being connected to the output of the loop filter;

a frequency divider having a signal input, a reset input and an output, the signal input being connected to the governable oscillator output and the output being connected to the second input of the phase detector, the frequency divider being operable to generate a frequency divided signal at its output based on the signal at its signal input; and a TIE reduction control circuit having first and second inputs and an output, the first input being connected to the signal sensing and switching circuit reference signal output, the second input being connected to the signal sensing and switching circuit switch signal output and the output being connected to the frequency divider reset input, wherein the TIE reduction control circuit comprises:

a first, second, third and fourth AND gate, each having a first input, a second inverted input and an output;

a fifth AND gate having a first, second, third and fourth inputs and an output, the fourth input being inverted, a first and second NOR gates, each NOR gate having three inputs and an output; and a first and second D-type flip-flop, each having a D and clock inputs, and a Q output, the D input of the first flip-flop being connected to the first NOR gate output, the D input of the second flip-flop being connected to the second NOR gate output and the clock inputs of the flip-flops being adapted to receive a clock signal, wherein the first input of the first, second and fifth AND gates are connected to the signal sensing and switching circuit switch output, the second input of the first and fifth AND gates are connected to the signal sensing and switching circuit reference signal output, the second input of the second, third and fourth AND gates and the third input of the fifth AND gate are connected to the Q output of the second D-type flip-flop, the first input of the third and fourth AND gate and the fourth input of the fifth AND gate are connected to the Q output of the first D-type flip-flop, the output of the first, second and third AND gates are connected to the inputs of the first NOR gate, the output of the second, third and fifth AND gates are connected to the inputs of the second NOR gate and the reset signal is generated at the output of the fourth AND gate.

* * * * *